United States Patent [19]

Hosoi et al.

[11] Patent Number: 4,651,220

[45] Date of Patent: Mar. 17, 1987

[54] METHOD OF RECORDING AND REPRODUCING IMAGES PRODUCED BY AN ELECTRON MICROSCOPE

[75] Inventors: Yuichi Hosoi; Junji Miyahara; Nobufumi Mori; Kenji Takahashi, all of Kanagawa, Japan

[73] Assignee: Fuji Photo Film Co., Ltd., Kanagawa, Japan

[21] Appl. No.: 786,080

[22] Filed: Oct. 10, 1985

[30] Foreign Application Priority Data

| Oct. 12, 1984 | [JP] | Japan | 59-214680 |
| Oct. 12, 1984 | [JP] | Japan | 59-214681 |
| Nov. 15, 1984 | [JP] | Japan | 59-241500 |
| Nov. 29, 1984 | [JP] | Japan | 59-252639 |
| Apr. 17, 1985 | [JP] | Japan | 60-81798 |

[51] Int. Cl.$^4$ ............................................. H04N 1/100
[52] U.S. Cl. .................................... 358/256; 358/111; 358/293; 250/311; 250/318; 250/319; 250/327.2
[58] Field of Search .................. 358/111, 256, 293; 250/318, 311, 319, 317.1, 327.2; 378/99, 62

[56] References Cited

U.S. PATENT DOCUMENTS

| 3,529,154 | 9/1970 | Bouwmeester | 250/311 |
| 3,823,322 | 7/1974 | Willasch et al. | 250/311 |
| 4,206,349 | 6/1980 | Kamimura | 250/311 |
| 4,527,060 | 7/1985 | Suzuki et al. | 250/327.2 |

Primary Examiner—Edward L. Coles, Sr.
Attorney, Agent, or Firm—Gerald J. Ferguson, Jr.; Michael P. Hoffman; Ronni S. Malamud

[57] ABSTRACT

A stimulable phosphor sheet is exposed to an electron beam having passed through a specimen in an electron microscope to record a first magnified image of the specimen on the sheet. A stimulating energy is applied to the sheet for discharging light therefrom which represents the first magnified image. The light discharged from the image sensor is photoelectrically detected to reproduce the first magnified image which can be observed to attain a desired focused condition and/or a desired field on the electron microscope. Then, the same or another stimulable phosphor sheet is exposed to the electron beam to record a second magnified image of the specimen on the sheet, and the second magnified image is reproduced as a final image under the desired focused condition and/or with the desired field.

13 Claims, 11 Drawing Figures

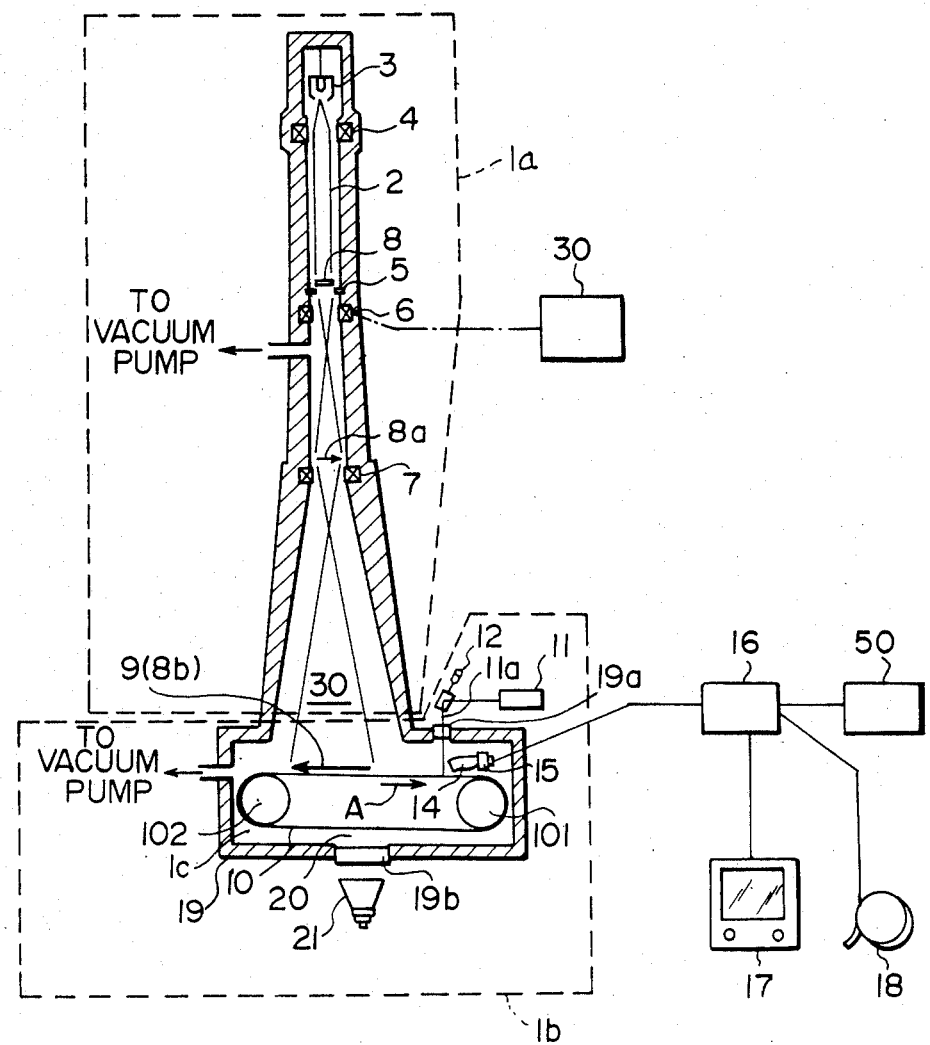
F I G. 3

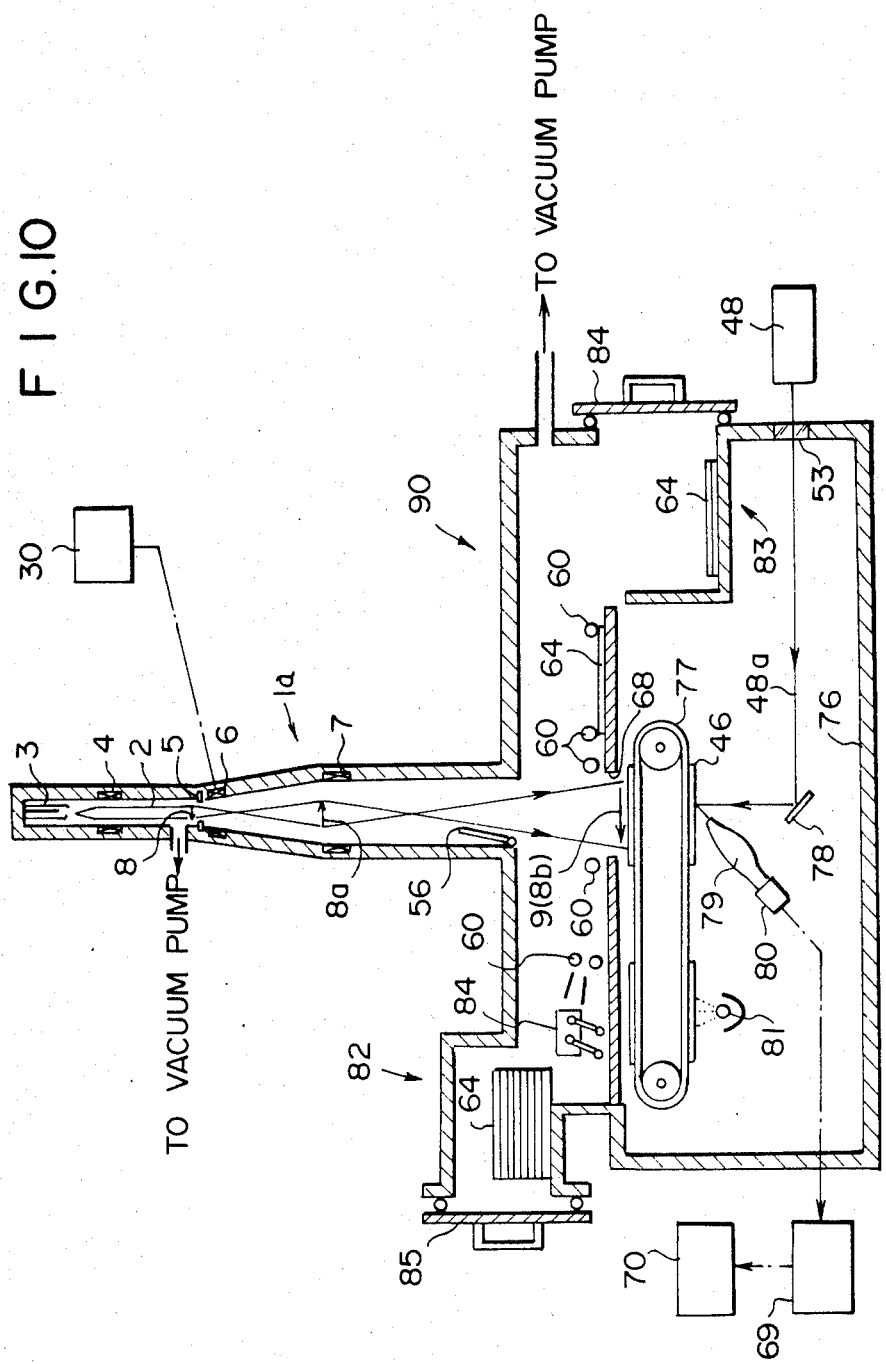

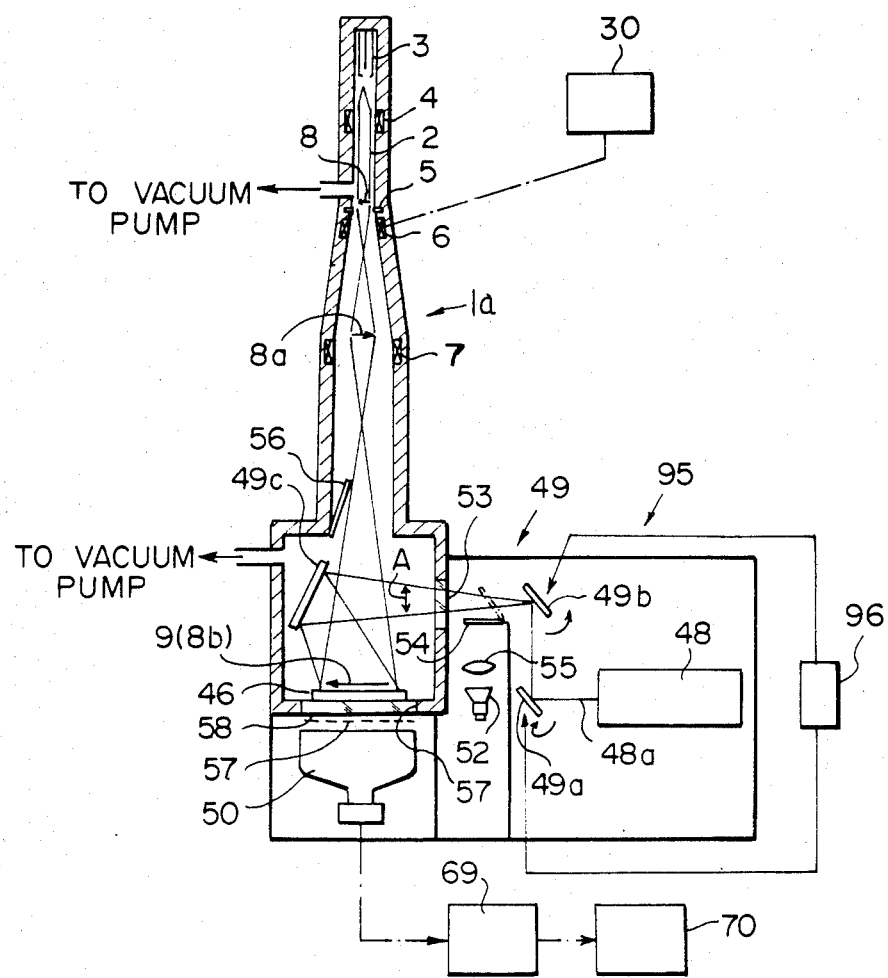

METHOD OF RECORDING AND REPRODUCING IMAGES PRODUCED BY AN ELECTRON MICROSCOPE

BACKGROUND OF THE INVENTION

1. Field of the Invention

The present invention relates to a method of recording and reproducing images produced by an electron microscope, and more particularly to a method of recording electron microscope images with high sensitivity and of reproducing the recorded electron microscope images in the form of electric signals in order to allow the images to be processed in various ways.

2. Description of the Prior Art

There are known electron microscopes for obtaining a magnified image of a specimen by deflecting a beam of electrons transmitted through the specimen with an electric or magnetic field. As is well known, the electron beam having passed through the specimen forms a diffraction pattern on the rear focal plane of the objective lens, and the diffracted beams interfere with each other again to produce the magnified image of the specimen. The magnified specimen image can be observed as a scattered-light image by projecting the image onto a screen with a projector lens. Alternatively, the rear focal plane of the objective lens may be projected for enabling the user to observe the magnified diffraction pattern of the image. Where an intermediate lens is positioned between the objective lens and the projector lens, the magnified scattered-light image or the diffraction pattern may be produced selectively as desired by adjusting the focal length of the intermediate lens.

The magnified image or the diffraction pattern (hereinafter referred to collectively as a "transmitted electron-beam image") may be observed in different manners. For example, one general practice has been to place a photographic film on the image formation plane for exposure to the transmitted electron-beam image. According to another design, an image intensifier is employed to amplify the transmitted electron-beam image for projection. The use of photographic films is however disadvantageous in that their sensitivity to electron beams is low and the process of developing the films is complex. The image intensifier also has drawbacks in that the images produced thereby have poor sharpness and are likely to become distorted.

Transmitted electron-beam images are often processed to make them more easier to see. Specifically, the transmitted electron-beam images are subject to various signal processing modes such as tone processing, frequency emphasis, density processing, subtractive processing, and additive processing. The images are also processed to reconstruct three-dimensional images by Fourier analysis, digitize the images, and measure particle diameters. The diffraction patterns are also processed to analyze crystal information and find lattice constants, dislocations, and lattice defects. For such image and diffraction pattern processing, it has been customary to convert the electron microscope image on a developed photographic film into an electric signal with a microphotometer, convert the electric signal into a digital signal, and then process the digital signal with a computer. This process has proven unsatisfactory since it is quite complex.

SUMMARY OF THE INVENTION

In view of the aforesaid problems of the prior electron microscope image recording devices, it is an object of the present invention to provide a method of recording and reproducing electron microscope images with high sensitivity and quality and of recording electron microscope images in a manner to be able to directly produce electric signals representing the images at the subsequent stage of image reproduction.

Another object of the present invention is to provide a method of recording and reproducing electron microscope images for field searching and/or focusing without damaging a specimen observed through the electron microscope.

According to the present invention, there is provided a method of recording and reproducing an image produced by an electron microscope, comprising the steps of exposing a two-dimensional image sensor under vacuum to an electron beam having passed through a specimen to record at least one first magnified image of the specimen on the image sensor, applying a stimulating energy to the image sensor for discharging light therefrom which represents the first magnified image, photoelectrically detecting the light discharged from the image sensor to produce a first electric signal and processing the first electric signal to produce the first magnified image which can be observed to attain a desired focused condition and/or a desired field on the electron microscope, thereafter exposing the same or another two-dimensional image sensor under vacuum to an electron beam having passed through the specimen to record a second magnified image of the specimen on the image sensor, applying a stimulating energy to the image sensor for discharging light therefrom which represents the second magnified image, and photoelectrically detecting the light discharged from the image sensor to produce a second electric signal and processing the second electric signal to produce the second magnified image as a final image under the desired focused condition and/or with the desired field.

The light discharged from the image sensor is photoelectrically detected while the image sensor is placed under vacuum. Each or the two-dimensional image sensor comprises a stimulable phosphor sheet capable of discharging luminescence as the light upon exposure to the stimulating energy. The stimulating energy is light or heat. The first magnified image is part of the second magnified image, or is composed of pixels larger than those of the second magnified image.

A plurality of the first magnified images of the specimen are successively produced which can be observed to attain different focused conditions and/or different fields, the second magnified image being produced as the final image under a selected one of the different focused conditions or with a selected one of the different fields.

The amount of the electron beam to record the first magnified image on the image sensor is preferably smaller than the amount of the electron beam to record the second magnified image on the image sensor.

In this case, the stimulating energy applied to the image sensor to discharge the light therefrom which represents the first magnified image is higher in level than the stimulating energy applied to the image sensor to discharge the light therefrom which represents the second magnified image.

Alternatively or additionally, different two-dimensional image sensors can be employed. In such a case, the first-mentioned two-dimensional image sensor is higher in sensitivity than the second-mentioned two-dimensional image sensor.

Further, the read-out speed for reading out the first-magnified image may be higher than the read-out speed for reading out the second-magnified image.

The method further includes the step of deriving read-out conditions and/or an image processing condition from the first electric signal, the second magnified image being produced as the final image also under the read-out conditions and/or the image processing condition. The read-out conditions are a read-out gain and a scale factor.

The two-dimensional sensor is made of a material capable of storing at least part of the energy of an electron beam when exposed to such an electron beam and of discharging, upon being subject to external stimulation, at least part of the stored electron beam energy in a detectable form such as light, electric energy, or sound, for example.

The two-dimensional sensor may preferably be in the form of a stimulable phosphor sheet disclosed in Japanese Unexamined Patent Publication Nos. 55-12429, 55-116340, 56-11395, and 56-104645 for example. A certain phosphor, when exposed to a radiation such as an electron ray, stores a part of the energy of the radiation. When the phosphor exposed to the radiation is exposed to stimulating rays such as visible light, the phosphor emits light (stimulated emission) in proportion to the stored energy of the radiation. Such a phosphor is called a stimulable phosphor, and the stimulable phosphor sheet is generally composed of a support and a stimulable phosphor layer disposed on the support. The stimulable phosphor layer may be formed by dispersing the stimulable phosphor in a suitable binder. However, the stimulable phosphor layer may itself be a stimulable phosphor sheet if it is self-supporting.

The two-dimensional sensor may also be in the form of a thermoluminescent phosphor sheet as revealed in Japanese Patent Publication Nos. 55-47719 and 55-47720, for example. The thermoluminescent phosphor sheet emits stored radiation energy as thermoluminescence when heat is applied to the sheet. The thermoluminescent phosphor sheet may be constructed in the same manner as the stimulable phosphor sheet.

The two-dimensional sensor is placed on the image formation plane of the electron microscope, and the electron microscope image is recorded on the two-dimensional sensor by the electron beam transmitted through the specimen. Then, the two-dimensional sensor on which the electron microscope image is stored is exposed to stimulating rays such as visible light to enable the sensor to emit the stored electron beam energy as light. The emitted light is then photoelectrically read to produce an electric signal indicative of the transmitted electron-beam image. The electric image signal thus generated may be employed to display the electron microscope image on a display unit such as a CRT, or to record the electron microscope image permanently as a hard copy, or to store the electron microscope image on a recording medium such as a magnetic tape, a magnetic disk, or the like.

The electron microscope images can be recorded with high sensitivity by the two-dimensional sensor of the type described above. Any undesired damage to the specimen can be reduced since the amount of the electron beam to which the specimen is exposed is small. The electric image signals produced from the two-dimensional sensor can be processed in various modes, such as tone processing and frequency emphasis, for example. The processing of diffraction patterns, and image analyses such as the reconstruction of three-dimensional images and image digitization can simply and quickly be performed by applying the electric signal to a computer.

Inasmuch as an image produced for field-searching and/or focusing purpose is reproduced by the two-dimensional sensor, as described above, the amount of the electron energy to which the specimen is exposed for field-searching and/or focusing the electron microscope can be reduced.

The stimulable phosphor employed in the stimulable phosphor sheet according to the present invention may comprise phosphors expressed by the composition formulas: SrS:Ce, Sm; SrS:Eu, Sm; ThO$_2$:Er; and La$_2$O$_2$S:Eu, Sm, as disclosed in U.S. Pat. No. 3,859,527.

The stimulable phosphor may also comprise phosphors expressed by the composition formulas: ZnS:Cu,Pb; BaO.xAl$_2$O$_3$:Eu [where $0.8 \leq x \leq 10$]; and $M^{II}$O.xSiO$_2$:A [where $M^{II}$ is Mg, Ca, Sr, Zn, Cd, or Ba; A is Ce, Tb, Eu, Tm, Pb, Tl, Bi, or Mx; and $0.5 \leq x \leq 2.5$], as disclosed in Japanese Unexamined Patent Publication No. 55(1980)-12142.

The stimulable phosphor may also comprise phosphors expressed by the composition formula: (Ba$_{l-x-y}$, Mg$_x$, Ca$_y$)FX:aEu$^{2+}$ [where X is at least one of Cl and Br; $0 < x+y \leq 0.6$, $xy \neq 0$, and $10^{-6} \leq a \leq 5 \times 10^{-2}$], as disclosed in Japanese Unexamined Patent Publication No. 55(1980)-12143.

The stimulable phosphor may also comprise phosphors expressed by the composition formula: LnOX:xA [where Ln is at least one of La, Y, Gd, and Lu; X is at least one of Cl and Br; A is at least one of Ce and Tb; and $0 < x < 0.1$] as disclosed in Japanese Unexamined Patent Publication No. 55(1980)-12144.

The stimulable phosphor may also comprise phosphors expressed by the composition formula: (Ba$_{1-x}$, $M^{II}_x$)FX:yA [where $M^{II}$ is at least one of Mg, Ca, Sr, Zn, and Cd, X is at least one of Cl, Br, and I; A is at least one of Eu, Tb, Ce, Tm, Dy, Pr, Ho, Nd, Yb, and Er; $0 \leq x \leq 0.6$, and $0 \leq y \leq 0.2$] as disclosed in Japanese Unexamined Patent Publication No. 55(1980)-12145.

The stimulable phosphor may also comprise phosphors expressed by the composition formula: $M^{II}$FX.xA:yLn [where $M^{II}$ is at least one of Ba, Ca, Sr, Mg, Zn, and Cd; A is at least one of BeO, MgO, CaO, SrO, BaO, ZnO, Al$_2$O$_3$, Y$_2$O$_3$, La$_2$O$_3$, In$_2$O$_3$, SiO$_2$, TlO$_2$, ZrO$_2$, GeO$_2$, SnO$_2$, Nb$_2$O$_5$, Ta$_2$O$_5$, and ThO$_2$; Ln is at least one of Eu, Tb, Ce, Tm, Dy, Pr, Ho, Nd, Yb, Er, Sm, and Gd; X is at least one of Cl, Br, and I; $5 \times 10^{-5} < x < 0.5$, and $0 < y < 0.2$] as disclosed in Japanese Unexamined Patent Publication No. 55(1980)-160078.

The stimulable phosphor may also comprise phosphors expressed by the composition formula: (Ba$_{1-x}$, $M^{II}_x$)F$_2$.aBaX$_2$:yEu$^{2+}$, zA [where $M^{II}$ is at least one of beryllium, magnesium, calcium, strontium, zinc, and cadmium; X is at least one of chlorine, bromine, and iodine; A is at least one of zirconium and scandium; $0.5 \leq a \leq 1.25$, $0 \leq x \leq 1$, $10^{-6} \leq y \leq 2 \times 10^{-1}$, and $0 < z < 10^{-2}$] as disclosed in Japanese Unexamined Patent Publication No. 56(1981)-116777.

The stimulable phosphor may also comprise phosphors expressed by the composition formula: (Ba$_{1-x}$, $M^{II}_x$)F$_2$.aBaX$_2$:yEu$^{2+}$, zB [where $M^{II}$ is at least one of beryllium, magnesium, calcium, strontium, zinc, and cadmium; X is at least one of chlorine, bromine and iodine; $0.5 \leq a \leq 1.25$, $0 \leq x \leq 1$, $10^{-6} \leq y \leq 2 \times 10^{-1}$, and $0 < z \leq 10^{-1}$] as disclosed in Japanese Unexamined Patent Publication No. 57(1982)-23673.

The stimulable phosphor may also comprise phosphors expressed by the composition formula: $(Ba_{1-x}, M^{II}_x)F_2 \cdot aBaX_2:yEu$, $zA$ [where $M^{II}$ is at least one of beryllium, magnesium, calcium, strontium, zinc, and cadmium; X is at least one of chlorine, bromine, and iodine; A is at least one of arsenic and silicon; $0.5 \leq a \leq 1.25$, $0 \leq x \leq 1$, $10^{-6} \leq y \leq 2 \times 10^{-1}$, and $0 < z \leq 5 \times 10^{-1}$], as disclosed in Japanese Unexamined Patent Publication No. 57(1982)-23675.

The stimulable phosphor may also comprise phosphors expressed by the composition formula: $(Ba_{1-x}M_{x/2}L_{x/2}FX:yEu^{2+}$ [where M is at least one alkaline metal selected from the group consisting of Li, Na, K, Rb, and Cs; L is at least one trihydric metal selected from the group consisting of Sc, Y, La, Ce, Pr, Nd, Pm, Sm, Gd, Tb, Dy, Ho, Er, Tm, Yb, Lu, Al, Ga, In, and Tl; X is at least one halogen selected from the group consisting of Cl, Br, and I; $10^{-2} \leq x \leq 0.5$, and $0 < y \leq 0.1$], as disclosed in Japanese Unexamined Patent Publication No. 58(1983)-206678.

The stimulable phosphor may also comprise phosphors expressed by the composition formula: $BaFX \cdot xA:yEu^{2+}$ [where X is at least one halogen selected from the group consisting of Cl, Br, and I; A is a calcined tetrafluoroboric compound; $10^{-6} \leq x \leq 0.1$, and $0 < y \leq 0.1$] as disclosed in Japanese Unexamined Patent Publication No. 59(1984)-27980.

The stimulable phosphor may also comprise phosphors expressed by the composition formula: $BaFX \cdot xA:yEu^{2+}$ [where X is at least one halogen selected from the group consisting of Cl, Br, and I; A is at least one calcined compound selected from the group consisting of the salts of monohydric or dihydric metals of hexafluorosilicic acid, hexafluorotitanic acid, and hexafluorozirconic acid; $10^{-6} \leq x \leq 0.1$, and $0 < y \leq 0.1$] as disclosed in Japanese Unexamined Patent Publication No. 59(1984)-47289.

The stimulable phosphor may also comprise phosphors expressed by the composition formula: $BaFX \cdot xNaX':aEu^{2+}$ [where each of X and X' is at least one of Cl, Br, as disclosed in Japanese Unexamined Patent Publication No. 59(1984)-56479.

The stimulable phosphor may also comprise phosphors expressed by the composition formula: $M^{II}FX \cdot xNaX':yEu^{2+}$ [where $M^{II}$ is at least one alkaline earth metal selected from the group consisting of Ba, Sr, and Ca; each of X and X' is at least one halogen selected from the group consisting of Cl, Br, and I; A is at least one transition metal selected from the group consisting of V, Cr, Mn, Fe, Co, and Ni; $0 < x \leq 2$, $0 < y \leq 0.2$, and $0 < z \leq 10^{-2}$] as disclosed in Japanese Unexamined Patent Publication No. 59(1984)-56480.

The stimulable phosphor may also comprise phosphors expressed by the composition formula: $M^{II}FX \cdot aM^IX' \cdot bM'^{II}X''_2 \cdot cM^{III}X'''_3 \cdot xA:YEu^{2+}$ [where $M^{II}$ is at least one alkaline earth metal selected from the group consisting of Ba, Sr, and Ca; $M^I$ is at least one alkaline metal selected from the group consisting of Li, Na, K, Rb, and Cs; $M'^{II}$ is at least one dihydric metal selected from the group consisting of Be and Mg; $M^{III}$ is at least one trihydric metal selected from the group consisting of Al, Ga, In, and Tl; A is a metal oxide; X is at least one halogen selected from the group consisting of Cl, Br, and I; X', X'', and X''' are at least one halogen selected from the group consisting of F, Cl, Br, and I; $0 \leq a \leq 2$, $0 \leq b \leq 10^{-2}$, $0 \leq c \leq 10^{-2}$, and $a+b+c \geq 10^{-6}$; $0 < x \leq 0.5$ and $0 < y \leq 0.2$] as disclosed in Japanese Unexamined Patent Publication No. 59(1984)-75200 filed by the present applicant.

The stimulable phosphor may also comprise phosphors expressed by the composition formula: $M^{II}X_2 \cdot aM^{II}X'_2:xEu^{2+}$ [where $M^{II}$ is at least one alkaline earth metal selected from the group consisting of Ba, Sr, and Ca; X and X' are at least one halogen selected from the group consisting of Cl, Br, and I with $X \neq X'$; $0.1 \leq a \leq 10.0$ and $0 < x \leq 0.1$] as disclosed in Japanese Unexamined Patent Publication No. 59(1984)-193161.

The stimulable phosphor which can be employed in the present invention is however not limited to the aforesaid phosphors, but may be any phosphor capable of stimulated emission upon exposure to stimulating light after it has been irradiated with a radiation.

Preferred thermoluminescent phosphors that can be used in the present invention include compounds produced by adding a small amount of at least one of Mn, Dy, and Tm to sulphuric compounds such as $Na_2SO_4$, $MnSO_4$, $CaSO_4$, $SrSO_4$, and $BaSO_4$.

The phosphor sheet may additionally have a protective layer and a light-reflecting or light-absorbing undercoated layer. The phosphor layer of the phosphor sheet may be colored with a pigment or a dye as disclosed in Japanese Unexamined Patent Publication No. 55(1980)-163500. The phosphor sheet may be in any desired shape such as a roll, an endless belt, a drum, or a plate.

The above and other objects, features and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 3 is a vertical cross-sectional view of a device for carrying out a method of recording and reproducing images produced by an electron microscope according to a third embodiment of the present invention;

FIGS. 5 through 11 are vertical cross-sectional views of devices for carrying out methods of recording and reproducing images produced by an electron microscope according to fourth through tenth embodiments, respectively, of the present invention.

DESCRIPTION OF THE PREFERRED EMBODIMENTS

Figure 1:
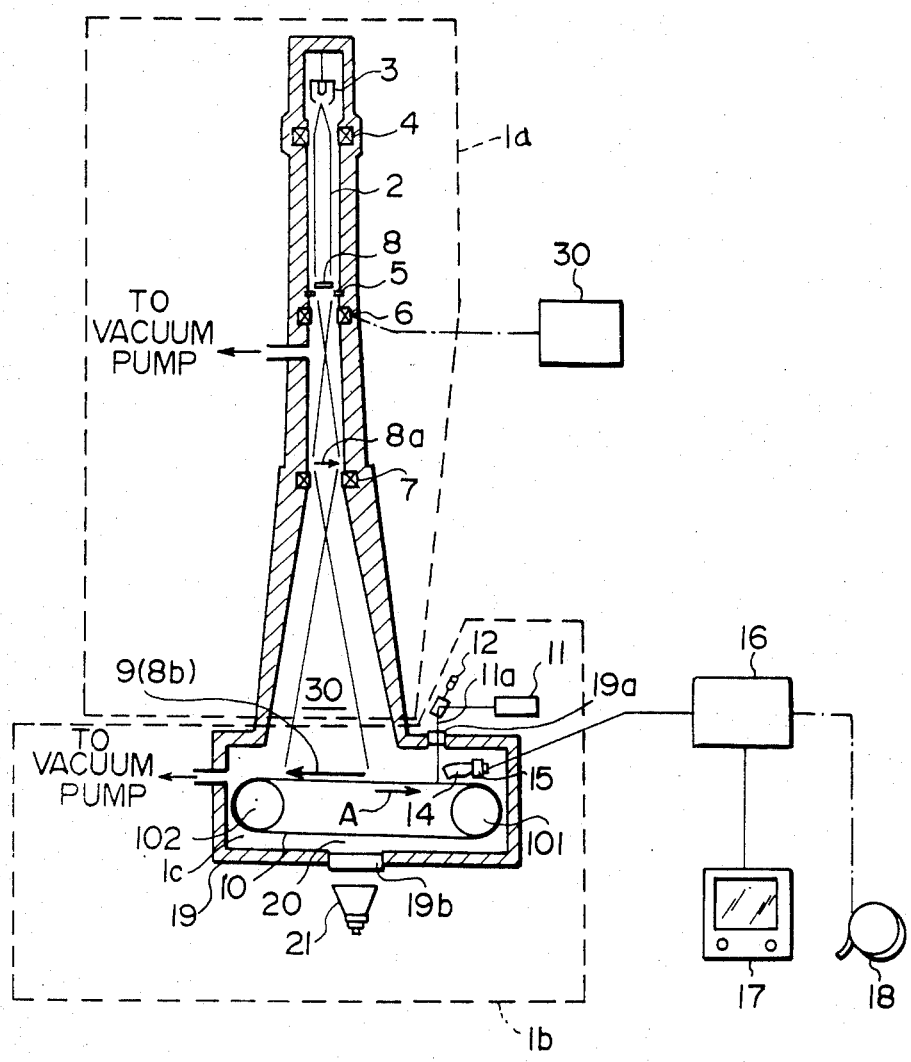
FIG. 1 is a vertical cross-sectional view of a device for carrying out a method of recording and reproducing images produced by an electron microscope according to a first embodiment of the present invention.

Like or corresponding parts are denoted by like or corresponding reference characters throughout several views:

FIG. 1 shows a device for recording and reproducing electron microscope images, the device being employed to perform a method according to a first embodiment of the present invention. The device consists of an electron microscope having a tubular lens barrel 1a and a recorder/reader assembly 1b composed of a stimulable phosphor sheet 10 serving as a two-dimensional image sensor, a stimulating means for scanning the stimulable phosphor sheet 10 with stimulating light while the stimulable phosphor sheet 10 is placed under vacuum, and a detector means for photoelectrically detecting luminescent light emitted by the stimulable phosphor sheet 10. The stimulable phosphor sheet 10 and the image-formation plane 9 of the electron microscope are positioned in one vacuum chamber 1c at least when the stimulable phosphor sheet 10 is exposed to an electron beam for recording an image thereon. The interior of the lens barrel 1a and the interior of the vacuum chamber are kept under vacuum by any known means such as a vacuum pump while the electron microscope is in operation.

The lens barrel 1a houses an electron gun 3 for emitting an electron beam 2 at a uniform speed, at least one convergent lens 4 comprising a magnetic lens or an electrostatic lens for converging the electron beam 2 toward a specimen 8, a specimen support 5, an objective lens 5 identical to the convergent lens 4, and a projector lens 7. The electron beam 2 having passed through the specimen 8 placed on the specimen support 5 is deflected by the objective lens 6 to form a magnified scattered-light image 8a of the specimen 8. The magnified scattered-light image 8a is focused by the projector lens 7 as an image 8b on the image-formation plane 9.

The stimulable phosphor sheet 10 in the recorder/reader 1b is in the form of an endless belt trained around a cylindrical driver roller 101 and a cylindrical driven roller 102 spaced horizontally from each other. The stimulating means has a stimulating light source 11 comprising an He—Ne laser or a semiconductor laser for emitting a stimulating light beam 11a and a light deflector 12 such as a galvanometer mirror for deflecting the stimulating light beam 11a transversely across the sheet 10 to scan the same. The vacuum chamber 1c is defined by a casing 19 communicating with the lens barrel 1a and having a light-transmissive wall member 19a made as of lead glass and through which the stimulating light beam 11a passes from the light deflector 12 toward the sheet 10. The detector means includes a light collecting body 14 for collecting luminescent light emitted from the sheet 10, and a photoelectric transducer 15 such as a photomultiplier coupled to the exit end of the light collecting body 14 for detecting the emitted liminescent light through a filter which removes the stimulating light to produce a corresponding electric signal. The stimulable phosphor sheet 10 is composed of a flexible endless-belt support and a stimulable lable phosphor layer deposited on the outer surface of the endless-belt support. The endless-belt stimulable phosphor sheet 10 is driven to run in the direction of the arrow A when the driver roller 101 is rotated by a drive unit such as a motor.

The endless-belt stimulable phosphor sheet 10, the driver roller 101, the driven roller 102, the light-collecting body 14, and the photoelectric transducer 15 are disposed in the vacuum chamber 1c. However, the exit end of the light collecting body 14 may project out of the casing 19 so that the photoelectric transducer 15 may be disposed outside of the vacuum chamber 1c.

In operation, a shutter (not shown) positioned between the electron microscope and the recorder/reader 1b is opened to expose the portion of the stimulable phosphor sheet 10 located in the image-formation plane 9 to an electron beam which bears the scattered-light image 8b of the specimen 8 for thereby storing the electron beam energy on the sheet 10. Then, the driver roller 101 is rotated to move the exposed portion of the sheet 10 toward a read-out section. The exposed portion of the sheet 10 is scanned transversely (primary scanning) by the stimulating light beam 11a deflected by the light deflector 12 and transmitted through the light-transmissive wall member 19a, while at the same time the sheet 10 is continuously moved in the direction of the arrow A so that the sheet 10 is scanned longitudinally (secondary scanning). Therefore, the stimulable phosphor sheet 10 is two-dimensionally scanned by the stimulating light beam 11a. Light which is emitted from the sheet 10 upon exposure to the stimulating light beam 11a enters the light collecting body 14 through its incident end and travels therethrough while being subject to total reflection therein. The light is then detected by the photoelectric transducer 15 which photoelectrically converts the amount of light into an electric signal.

The electric signal generated by the photoelectric transducer 15 is processed by an image signal processor 16, and processed signal is fed to an image reproducer 17 such as a CRT display. Therefore, the magnified scattered-light image 9b borne by the light emitted from the sheet 10 can be reproduced.

The reproduced image thus obtained of the magnified scattered-light image 8b is employed for the operator to focus the magnified scattered-light image 8b sharply on the image-formation plane 9. More specifically, while observing the reproduced image of the magnified scattered-light image 8b on the CRT display 17, the operator controls a focusing control knob 30 for varying the electric or magnetic field of the objective lens 6 to change its focal length thereby to adjust the focused condition of the magnified scattered-light image 8b.

After the image 8b has been focused, the magnified scattered-light image 8b is recorded again on a new unexposed portion of the sheet 10 in the same process as described above. The magnified scattered-light image 8b newly recorded on the sheet 10 is read out and reproduced on the CRT display 17 in the same way as described above. The image 8b reproduced at this time is therefore more sharply focused than the previously recorded image 8b. If the focused condition of the second image 8b is acceptable to the operator, then the reproduced image is used as a final image which may immediately be reproduced on the CRT display 17. Alternatively, the electric signal representative of the image 8b may be stored on a recording medium 18 such as a magnetic tape.

If the second reproduced image 8b is still out of focus, then the focusing control knob 30 may be adjusted again to correct the focused condition, and the third image 8b may be recorded, read out, and reproduced in the foregoing manner. Such a focusing cycle may be repeated as many times as desired to obtain a reproduced image which is sharply focused. Since the magnified scattered-light image 8b can quickly be reproduced on the CRT display 17, the image reproduced for focusing purpose should preferably be displayed on the CRT display 17 for higher efficiency even when a hard copy of the image is to be produced.

After the image has been read from the sheet 10, the exposed portion thereof is fed to an erasing zone 20 where erasing light emitted from an erase light source 21 such as a fluorescent lamp disposed outside of the casing 19 is radiated onto the sheet 10 through a light-transmissive wall member 19b supported on the casing 19. The erasing light is in the same wavelength region as that of the stimulating light for the stimulable phosphor sheet 10. Therefore, upon exposure to the erasing light from the erase light source 21, any remanent image stored in the phosphor layer of the sheet 10 and noise arising from a radioactive element such as $^{226}$Ra contained as impurities in the phosphor layer can be discharged from the sheet 10. The erase light source 21 may comprise a tungsten lamp, halogen lamp, an infrared lamp, a xenon flash lamp, or a laser source, as disclosed in Japanese Unexamined Patent Publication No. 56(1981)-11392.

An appropriate light-shielding shutter may be disposed between the image-formation plane 9 or a recording area and the detector means 14, 15 or a reading area for simultaneously allowing a focusing image and a next image to be read from and recorded on, respectively, the sheet 10. Instead of the endless-belt stimulable phosphor sheet 10, a single stimulable phosphor sheet may be fed back and forth between the recording and reading areas for alternately recording and reading images. Alternatively, one or more stimulable phosphor sheets may be attached to an endless belt for being cyclically used to record and read images.

The image produced for focusing purpose may not be the same size as that of a final image, but may be obtained as a portion of the image by radiating stimulating light onto and detecting light emitted from only part of the entire image frame. This shortens the time required for reproducing the focusing image, and hence the focusing process can be effected more efficiently. As an alternative, a focusing image may be read as larger pixels than those of a final image for greater efficiency.

After a focusing image has been read from the sheet 10, it is not necessary to expose the sheet 10 to the erasing light if a next focusing image is to be recorded on the sheet 10. More specifically, the signal produced by reading the first focusing image is stored in a memory, and the second focusing image is then recorded on the sheet 10 over the sheet portion where the first focusing image was recorded. In the next image reading cycle, the stored signal of the first focusing image is subtracted from the entire read signal thereby to attain only the signal of the second focusing image.

The image produced for focusing purpose may be employed for determining a desired field of the final image. That is, the field search can be conducted by moving the specimen 8 or changing the position of the scanning area of the electron beam 2 little by little as done in the conventional electron microscope.

A shutter may be positioned between the specimen 8 and the electron gun 3 for preventing the electron beam from reaching and hence damaging the specimen 8 when the image thereof is not to be recorded.

Figure 2:
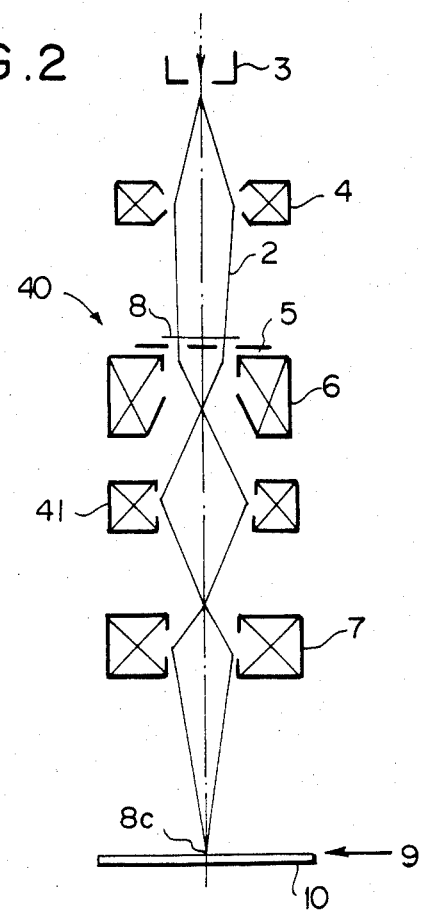
FIG. 2 is a schematic view of an electron microscope which can be employed to effect a method according to a second embodiment of the present invention.

The principles of the present invention can be employed for recording and reproducing the diffraction pattern of a specimen. FIG. 2 is explanatory of a method of a second embodiment for recording and reproducing such a diffraction pattern 8c. The electron microscope, generally denoted at 40, has an intermediate lens 41 disposed between the objective lens 6 and the projector lens 7. The diffraction pattern 8c of the specimen 8, which is formed on the rear focal plane of the objective lens 7, is magnified by the intermediate lens 102 and the projector lens 7 with their focal points on the rear focal plane of the objective lens 7 and is projected onto the image-formation plane 9. By placing the stimulable phosphor sheet 10 in the image-formation plane 9, the magnified image of the diffraction pattern 8c can be recorded by the electron beam 2 on the stimulable phosphor sheet 10. The recorded diffraction pattern 8c can be read in the same manner as described with reference to FIG. 1, and the read image can be displayed on the CRT or printed as a hard copy.

A recorded pattern or recorded information is determined by the recorded condition of a transmitted electron-beam image recorded on the stimulable phosphor sheet 10, the nature of the specimen 8, and the manner of recording the image. For eliminating any adverse effect arising from varied recording conditions or for obtaining an electron microscope image which can clearly be observed, such recorded information should be obtained prior to the reproduction of a visible image by which the specimen can be observed. The read-out gain (read-out condition) should be adjusted or the image-dependent signal should be processed by the obtained recorded information. Furthermore, the generation of a reproduced image which can effectively be observed requires that a scale factor (latitude: read-out condition) be determined in order to optimize the resolution of the reproduced image dependent on the contrast of the recorded pattern.

One way of obtaining the recorded information on the sheet 10 before a visible image is produced for observing the specimen 8 is disclosed in Japanese Unexamined Patent Publication No. 58(1983)-89245. More specifically, prior to the generation of a visible image for observing the specimen 8 (main reading mode), the recorded information stored in the stimulable phosphor sheet 10 is read (advance reading mode) with stimulating light having a lower energy than that of stimulating light to be applied in the main reading mode. Based on the recorded information thus obtained, the read-out gain is suitably adjusted or a scale factor is determined for the main reading mode, or the signal generated in the main reading mode is processed.

Alternatively, the image produced for focusing purpose may be reproduced on the CRT display 17, and the operator may determine a suitable read-out gain, a scale factor, or signal processing conditions while observing the focusing image displayed on the CRT display 17. Then, the final image may be read out according to the determined read-out gain or the scale factor, or the image signal may be processed under the determined processing conditions.

The photoelectric detector means 14, 15 may comprise a solid-state photoelectric transducer rather than the photomultiplier (see Japanese Patent Application Nos. 58(1983)-86226, 59(1983)-86227, 58(1983)-219313, and 58(1983)-219314, and Japanese Unexamined Patent Publication No. 58(1983)-121874). A plurality of solid-state photoelectric transducer elements may be disposed in covering relation to the entire surface of the stimulable phosphor sheet 10, or may be located closely to the sheet 10. The photoelectric detector means may also comprise a line sensor composed of an array of solid-state photoelectric transducer elements, or a single solid-state photoelectric transducer element corresponding to one pixel and movable to scan the entire surface of the sheet 10.

The source 11 of stimulating light may comprise an array of light-emitting diodes or semiconductor lasers for preventing a loss of light emitted from the sheet 10 and for allowing the detector means to detect emitted light at a larger angle for an increased S/N ratio. The electric signal generated by the detector means can be read out at a high speed since the signal is rendered time-dependent by electric processing in the detector means, not by time-dependent application of the stimulating light.

The stimulable phosphor sheet may comprise a thermofluorescent phosphor sheet. For discharging the stored energy from the thermofluorescent phosphor sheet, the sheet may be scanned by thermal radiation emitted from a heat source such as a $CO_2$ laser source. For more details, reference should be made to Japanese Patent Pubulication No. 55(1980)-47720.

After the image has been recorded on the stimulable phosphor sheet 10, the vacuum in the vacuum chamber 10 may be removed, the sheet 10 may be taken out of the vacuum chamber 1c, and the image stored therein may be read by an image reader separate from the electron microscope 1a. However, where the stimulable phosphor sheet 10 is repeatedly used in the vacuum chamber 1c as illustrated, a number of images can successively be recorded and reproduced without changing stimulable phosphor sheets.

FIG. 3 shows an arrangement for carrying out a method according to a third embodiment of the present invention. According to the third method, a plurality of images of the specimen 8 for focusing purpose are successively recorded on the stimulable phosphor sheet 10 while the focusing control knob 30 is slightly turned successively by the operator. Therefore, the recorded images for focusing purpose are focused slightly differently on the sheet 10. At this time, the settings (focusing conditions) of the focusing control knob 30 for the respective focusing images are recorded or stored. It is not necessary to record the entire focusing images on the sheet 10, but only a portion of each of the focusing images may be recorded on the sheet 10 for focusing purpose as by partly opening the shutter (not shown) between the electron microscope 1a and the recorder/reader 1b. Therefore, the time required for generating the necessary focusing images can be shortened.

Figure 4:
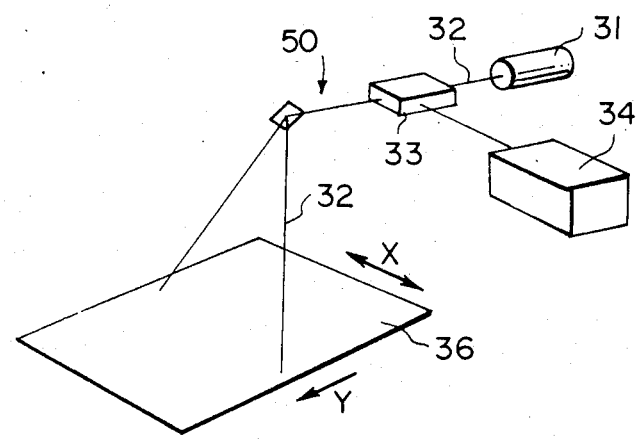
FIG. 4 is a perspective view of an image recorder for recording an electron microscope image which has been stored in a stimulable phosphor sheet by the device shown in FIG. 3.

Then, the focusing images are displayed on the CRT display 17 or recorded by an image recorder 50. As shown in FIG. 4, the recorder 50 includes a laser 31 for generating a laser beam 32 which is modulated by an acoustooptic modulator 33 supplied with an image signal from an image signal supply circuit 34. The modulated laser beam 32 is deflected by a light deflector 35 to scan a photosensitive sheet 36 in the directions of the arrow X (primary scanning) while the photosensitive sheet 36 is moved in the direction of the arrow Y (secondary scanning). The image signal supply circuit 34 is supplied with the signal from the image signal processor 16 (FIG. 3). The visible image recorded on the photosensitive sheet 36 is larger in size the image-formation plane 6 or the area of the stimulable phosphor sheet 10 where the image is recorded. Therefore, the magnified scattered-light image 8b is reproduced on the photosensitive sheet 36 at an enlarged size larger than that in the image-formation plane 9. Since the magnified scattered-light image 8b is reproduced with high sharpness by using the stimulable phosphor sheet 10, the enlarged image on the photosensitive sheet 36 is sharp enough for the operator to observe for the purpose of checking the focused condition thereof. Accordingly, the stimulable phosphor sheet 10 may be small in size, and hence the photoelectric transducer 15 may also be small in size.

When generating the image enlarged by the image recorder shown in FIG. 4, the density of scanning lines over the photosensitive sheet 36 may be coarser than that of scanning lines employed for obtaining image information from the stimulable phosphor sheet 10. The density of scanning lines for producing sufficient image information from the stimulable phosphor sheet 10 should be higher than 10 pixels/mm, preferably in the range of from 15 pixels/mm to 100 pixels/mm. However, the density of scanning lines to record the image in the image recorder of FIG. 4 should be coarser, preferably in the range of from 5 pixels/mm to 20 pixels/mm for producing the enlarged image without degrading its quality.

The differently focused images are thus successively displayed on the CRT display 17 or recorded on respective photosensitive sheets 36 or on one photosensitive sheet 36 at successive areas thereof. The operator compares the displayed or recorded images, and selects the best focused image. If the selected image is representative of the entire magnified scattered-light image 8b, then the selected image is employed as the final image. If the selected image is indicative of only a portion of the magnified scattered-light image 8b, then the magnified scattered-light image 8b is recorded on the sheet 10 and reproduced on the CRT display 17 or recorded on the photosensitive sheet 36 or the recording medium 18. At this time, the focusing control knob 30 is set to the recorded or stored focus setting at which the best focused image is produced. The objective lens 6 may automatically be adjusted to produce the best focused image according to the recorded or stored focus setting.

In order to determine a desired field of the final image, the specimen 8 is moved or the position of the scanning area of the electron beam 2 is changed little by little to search the desired field.

In the event that the focusing images are to be displayed on the CRT display 17, they should preferably be recorded on a magnetic disc or the like so that they can repeatedly be displayed on the CRT display 17 in any desired sequence for easier focus comparison.

Figure 5:
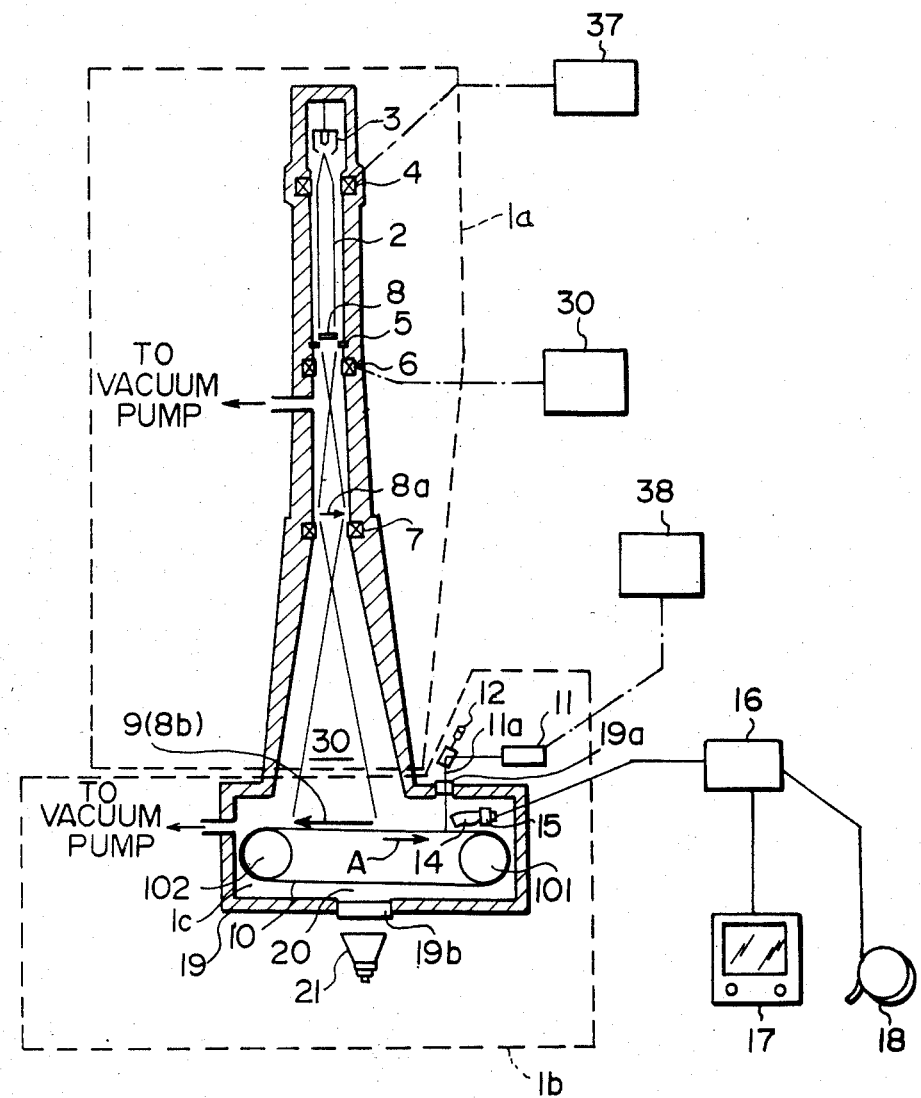

FIG. 5 illustrates an arrangement for carrying out a method according to a fourth embodiment of the present invention. When recording an image of the specimen 8 on the stimulable phosphor sheet 10 for focusing purpose, the intensity of the electron beam emitted from the electron gun 3 is selected by an adjustment switch 37 to be lower than that of the electron beam to be emitted for recording the magnified scattered-light image 8b as a final image. More specifically, the current supplied to the convergent lens 4 may be varied to lower the density of electrons applied to the specimen 8 per unit area. Alternatively, the current flowing through the filament of the electron gun 3 is lowered to reduce the intensity of thermions given off from the filament, or the speed of movement of a shutter (not shown) disposed between the electron gun 3 and the specimen 8 is increased. The image thus recorded on the sheet 10 is then detected by the photoelectric transducer 15. At this time, the energy of the stimulating light 11a emitted from the laser 11 is increased by an output adjustment switch 38 to a level higher than the level at which a final image will be read. Since the light emitted from the sheet 10 and detected by the photoelectric transducer 15 is increased, the energy thereof can be detected by the photoelectric transducer 15 with high sensitivity even if the amount of the electron beam emitted from the electron gun 3 is reduced.

The image derived from the signal from the photoelectric transducer 15 is then displayed on the CRT display 17 for the operator to be able to judge the focused condition of the image. If the image is to be defocused, then the operator adjusts the focusing control knob 30 to correct the focused condition of the magnified scattered-light image 8b. After the desired focused condition has been reached, the magnified scattered-light image 8b is recorded again on the sheet 10 which has been moved in the direction of the arrow A. At this time, the intensity of the electron beam applied to the specimen 8 is increased by the adjustment switch 37, and the energy level of the stimulating light 11a is lowered. The magnified scattered-light image 8b is therefore recorded with high sharpness to allow the operator to observe the same effectively. The recorded magnified scattered-light image 8b is then displayed on the CRT display 17 or recorded on the recording medium 18. The above focusing process may be repeated as many times as desired to produce a more sharply focused image.

Because of the increased read-out sensitivity, the image produced for focusing purpose is less sharp than the final image. However, the less sharp image does not adversely affect the focusing process. The energy of the stimulating light 11a may be increased by employing an optical means to reduce the diameter of the beam of the stimulating light 11a, or lowering the speed of primary or secondary scanning, or removing from the optical path an ND filter which is used to attenuate the stimulating light beam 11a when the final image is to be read.

Figure 6:
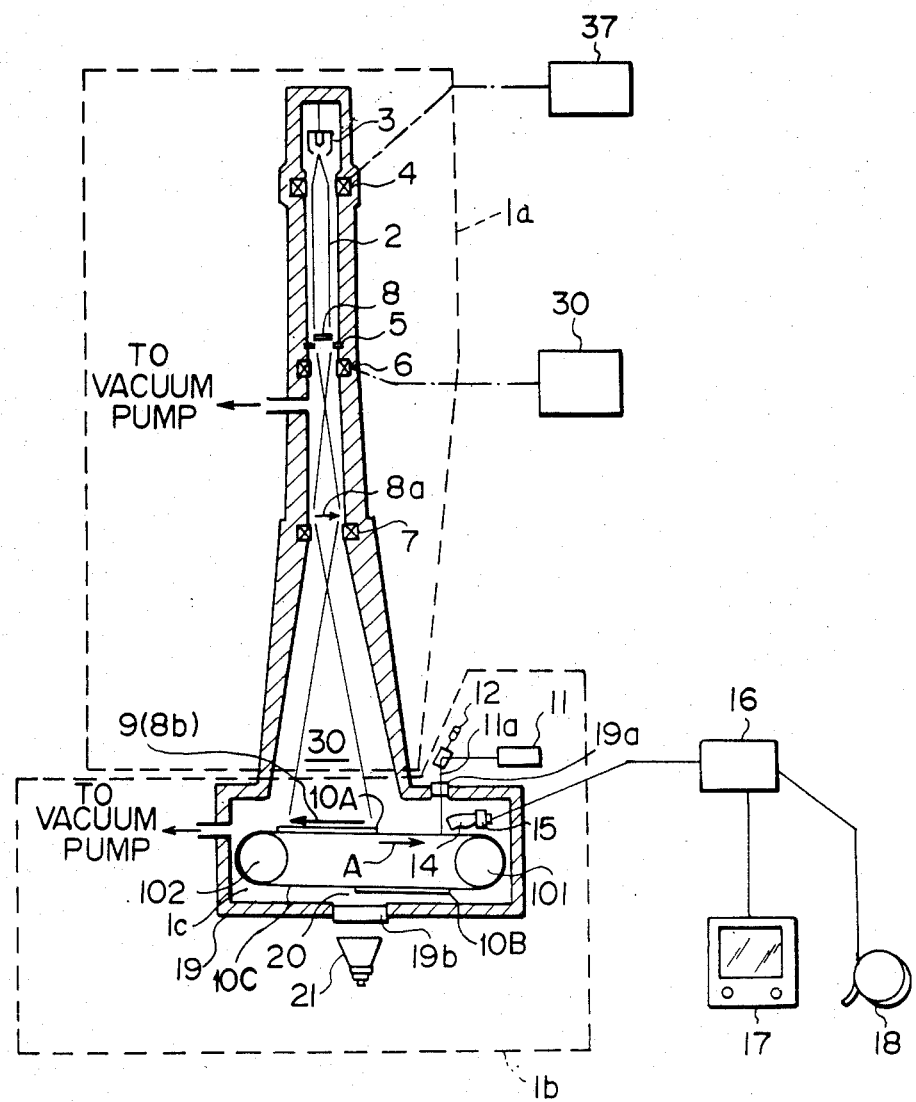

According to a fifth embodiment illustrated in FIG. 6, a plurality (two in the illustrated embodiment) of stimulable phosphor sheets 10A, 10B are fixed to the outer surface of an endless belt 10C trained around the driver and driven rollers 101, 102. The stimulable phosphor sheet 10A is of higher sensitivity for recording a focusing image thereon, and the stimulable phosphor sheet 10B is of lower sensitivity for recording a final image thereon. Therefore, the electron beam to be applied to the specimen 8 when the focusing image is to be recorded on the stimulable phosphor sheet 10A may be lowered in intensity. The final image recorded on the stimulable phosphor sheet 10B and reproduced therefrom is sharper than the focusing image, and the reproduced magnified scattered-light image 8b can be observed highly effectively.

The sensitivity of the stimulable phosphor sheet 10A can be increased by enlarging the particle size of the stimulable phosphor for higher light emission efficiency, increasing the thickness of the stimulable phosphor layer, using a stimulable phosphor having higher light emission efficiency, or reducing the amount of a pigment or a dye contained in the stimulable phosphor layer for preventing stimulating light from being scattered (see Japanese Unexamined Patent Publication No. 55(1980)-163500). When the focusing image recorded on the stimulable phosphor sheet 10A is to be read therefrom, the energy level of the stimulating light applied thereto may be increased.

Figure 7:
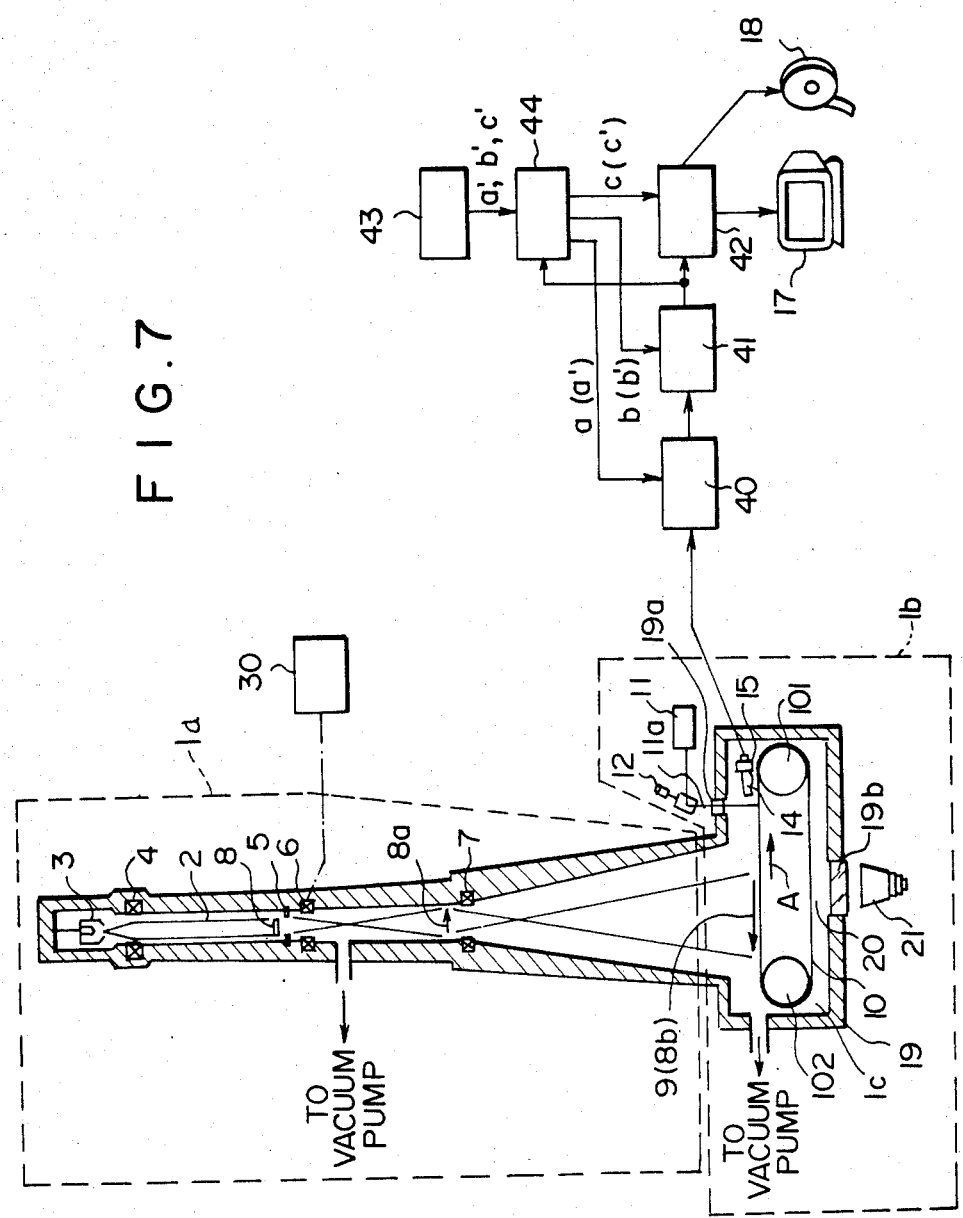

FIG. 7 is explanatory of a method according to a sixth embodiment of the present invention. The electric signal produced by the photoelectric transducer 15 for reproducing a focusing image is amplified by an amplifier 40 at a fixed read-out gain a', and the amplified signal is converted by an A/D converter 41 into a digital signal at a fixed scale factor b'. The digital signal is then processed by a signal processor 42 under a fixed image C processing condition c'. The processed signal is fed to the CRT display 17 in which it is displayed, or the recorder in which it is recorded on a photosensitive sheet. The above focusing image is recorded and reproduced for the operator to check the focused condition of the image before the magnified scattered-light image 8b is reproduced as a final image. The fixed read-out gain a', the fixed scale factor b', and the fixed image processing condition c' are stored in a memory 43 and delivered through a control circuit 44 to the amplifier 40, the A/D converter 41, and the signal processor 42, respectively. The digital signal issued from the A/D converter 41 is also applied to the control circuit 44.

While observing the focusing image, the operator adjusts the control focusing knob 30 to correct the focused condition of the image. When the corrected focus of the image is acceptable, then the magnified scattered-light image 8b is recorded again on the sheet 10 and reproduced on the CRT display 17 or recorded on the recording medium 18. If the second reproduced image is still not well focused, then the above focusing process may be repeated again as many times as desired to obtain a well focused image.

The digital signal produced by the A/D converter 41 and indicative of the recorded information stored in the sheet 10 for producing the first focusing image is applied to the control circuit 44. The control circuit 44 then issues a read-out gain a, a scale factor b, and an image processing condition c dependent on the digital signal, and applies them to the amplifier 40, the A/D converter 41, and the signal processor 42, respectively. Therefore, the second image is read out and reproduced as another focusing image or a final image by amplifying the output signal from the photoelectric transducer 15 at the read-out gain a, converting the amplified signal into a digital signal with the A/D converter 41 at the scale factor b, and processing the digital signal with the image signal processor 42 under the image processing condition c. The digital signal from the A/D converter 41 may be processed by the image signal processor 42 in the frequency processing mode as disclosed in U.S. Pat. Nos. 4,346,295, 4,315,318 and 4,387,428, or in the tone processing mode as disclosed in U.S. Pat. Nos. 4,302,672, 4,276,473 and 4,310,886.

After the operator has confirmed that the focusing image is well focused, the sheet 10 may be moved back to the reading area, and the image may be read therefrom as a final image. The image signal produced by the photoelectric transducer 15 is then amplified at the read-out gain a, converted into a digital signal at the scale factor b, and finally processed under the image processing condition c. At this time, it is preferable to read the focusing image with stimulating light of a lower energy level than that of stimulating light applied to produce the final image. The energy level of the stimulating light can be reduced by removably positioning a light-quantity reducing means and/or a beam-diameter increasing means in the optical path of the stimulating light, as revealed in Japanese Unexamined Patent Publication Nos. 58(1983)-67243 and 58(1983)-67244.

Figure 8:
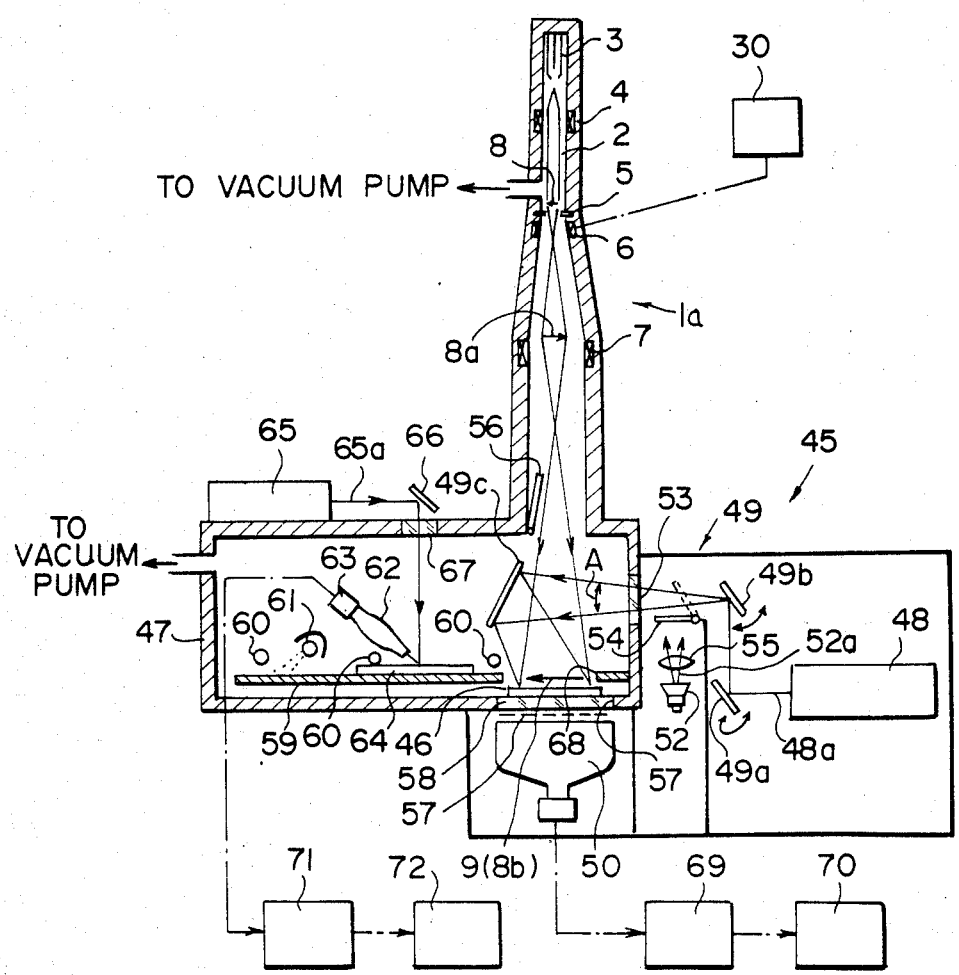

A method according to a seventh embodiment of the present invention is carried out by a device shown in FIG. 8. The device includes an electron microscope which is identical to those of the previous embodiments and an image recorder/reader 45. The image recorder/reader 45 includes a first two-dimensional image sensor 46 comprising a stimulable phosphor sheet fixed in the image-formation plane 9 and placing in a casing 47 connected to the lens barrel 1a, a first stimulating means composed of a stimulating light source 48 and an optical scanning system 49, a first photomultiplier 50 disposed in confronting relation to the stimulable phosphor sheet 46 through a light-transmissive window 51 defined in the wall of the casing 47, and a first erase light source 52.

The stimulable phosphor sheet 46 comprises a stimulable phosphor layer deposited on a transparent support. The stimulating light source 48 may comprise an He - Ne laser or a semiconductor laser. The optical scanning system 49 is composed of first and second light deflectors 49a, 49b disposed outside of the casing 47 and a fixed mirror 49c disposed in the casing 47. Each of the light deflectors 49a, 49b may be in the form of a galvanometer mirror, a polygonal mirror, a hologram scanner, or an acoustooptic deflector. A stimulating laser beam 48a emitted from the stimulating light source 48 is deflected by the first light deflector 49a in a first direction, and then deflected by the second light deflector 49b in a direction normal to the first direction as indicated by the arrow A. The deflected light beam 48a is passed through a sheet of lead glass fitted in a light-transmissive window 53 defined in the wall of the casing 47, and deflected by the fixed mirror 49c to impinge upon the stimulable phosphor sheet 46. The stimulable phosphor sheet 46 is therefore two-dimensionally scanned by the laser beam 48a. The laser beam 48a is preferably passed through a filter (not shown) for cutting off the wavelength region of light emitted from the stimulable phosphor sheet 46, then adjusted in beam diameter by a beam expander (not shown) before being deflected by the light deflectors 49a, 49b, and finally passed through an f$\theta$ lens into a uniform beam diameter prior to application to the stimulable phosphor sheet 46.

The erase light source 52 emits light in the same wavelength region as that of stimulating light to be applied to the stimulable phosphor sheet 46. A mirror 54 is positioned for angular movement between a first position in the path of the laser beam 48a between the second light deflector 49b and the fixed mirror 49c and a second position out of the path of the laser beam 48a. When the mirror 54 is in the first position, erasing light 52a emitted from the erase light source 52 is gathered by a lens 55 and reflected by the mirrors 54, 49c to fall on the stimulable phosphor sheet 46 over its entire surface. A shutter 56 for blocking the electron beam 2 is angularly movably positioned between the lens barrel 1a and the casing 47. A light shutter 57 is disposed between the stimulable phosphor sheet 46 and the first photomultiplier 50. A sheet 58 of glass fitted in the window 51 has an optical filter for allowing light emitted from the stimulable phosphor sheet 46 to pass therethrough while cutting off the stimulating light beam 48a. The interior of the lens barrel 1i a and the casing 47 is kept under vacuum by a vacuum pump (not shown).

The casing 47 accommodates therein a sheet feed table 59, a plurality of sheet feed rollers 60 disposed along the sheet feed table 59, a second erase light source 61, a light collecting body 62, a second photomultiplier 63 optically coupled to the light collecting body 62, and a second two-dimensional image sensor 64 comprising a stimulable phosphor sheet movably placed on the sheet feed table 59. The second stimulable phosphor sheet 64 can be moved back and forth on the sheet feed table 59 by rotating the sheet feed rollers 60 in one direction and the other. A second stimulating source comprises a stimulating light source 65 identical to the stimulating light source 48 and a light deflector 66 identical to the light deflector 49a or 49b. A stimulating light beam 65a emitted from the stimulating light source 48 is deflected by the light deflector 66 to pass through a light-transmissive window 67 in the casing wall for scanning the stimulable phosphor sheet 64 in the direction normal to the direction in which the stimulable phosphor sheet 64 is movable on the sheet feed table 59. The sheet feed table 59 has an opening 68 defined therein above the first stimulable phosphor sheet 46. The first stimulable phosphor sheet 46 can be exposed to the electron beam 2 when the second stimulable phosphor sheet 64 is moved to the left (FIG. 8) from the position over the opening 68.

Operation of the image recorder/reader 45 for recording and reading an electron microscope image is as follows: First, a field search mode is carried out. The second stimulable phosphor sheet 64 is positioned as shown away from the opening 68. When the shutter 56 is opened as illustrated, the first stimulable phosphor sheet 46 is exposed to the electron beam 2 to store the energy of the electron beam 2 which carries the magnified scattered-light image 8b of the specimen 8. The light shutter 57 should preferably be closed while the first stimulable phosphor sheet 46 is exposed to the electron beam 2. Then, the shutter 19 is closed and the light shutter 57 is opened. The stimulating light source 48 is energized to emit the stimulating light beam 48a which is deflected to scan the first stimulable phosphor sheet 46 two-dimensionally. The first stimulable phosphor sheet 46 now emits light in an intensity commensurate with the energy level of the electron beam 2 which has been applied to the sheet 46. The light thus emitted from the sheet 46 is photoelectrically detected by the first photomultiplier 50 through the glass sheet 58.

The electric signal generated by the first photomultiplier 50 is processed by an image signal processor 69, and the processed signal is fed to a monitor image reproducer 70 such as a CRT display. Therefore, the magnified scattered-light image 8b can be reproduced from the light emitted by the first stimulable phosphor sensor 46.

The operator adjusts the position of the specimen 8 on the specimen support 5 while observing the magnified scattered-light image 8b on the CRT display 70, so that the reproduced image 8b will be in a desired field.

The monitor image on the first stimulable phosphor sheet 46 is read out at a speed sufficiently higher than the speed at which an image is read from the second stimulable phosphor sheet 64 (described later on). For such a high-speed read-out operation, the stimulating light beam 48a is two-dimensionally swept at a higher speed, or the image is read from the first stimulable phosphor sheet 46 as larger pixels.

After the image has been read from the first stimulable phosphor sheet 46 for display on the CRT display 70, the light shutter 57 is closed and the mirror 54 is swung into the first position in the optical path of the light beam 48a. The first erase light source 52 is energized to apply the erasing light 52a to the surface of the first stimulable phosphor sheet 46 via the mirrors 54, 49c. Any residual image is now removed from the first stimulable phosphor sheet 46, which can then be recycled. Upon exposure to the erasing light 52a, noise arising from a radioactive element such as $^{226}$Ra contained as impurities in the phosphor of the sheet 46 can also be discharged. The stimulating light source 48 may double as a light source for emitting the erasing light 52a.

The aforesaid field search mode is carried out in one or more cycles to obtain the magnified scattered-light image 8b in a desired field. Then, the magnified scattered-light image 8b is recorded and read in a main reading mode. First, the shutter 56 is closed, and the second stimulable phosphor sheet 64 is moved by the sheet feed rollers 60 to the position over the opening 68. Then, the shutter 56 is opened to enable the second stimulable phosphor sheet 64 to store the energy of the electron beam 2 which represents the magnified scattered-light image 8b. The shutter 56 is closed again, and the second stimulable phosphor sheet 64 is moved at a prescribed speed in the opposite direction by the sheet feed rollers 60. During this time, the second stimulable phosphor sheet 64 is scanned by the stimulating light beam 65a (primary scanning) while the sheet 64 is moved back (secondary scanning). Therefore, the second stimulable phosphor sheet 64 is two-dimensionally scanned by the stimulating light beam 65a to emit light which is collected light collecting body 62 and photoelectrically detected by the second photomultiplier 63.

The electric signal generated by the second photomultiplier 63 is processed by an image signal processor 71 and the processed signal is fed to an image reproducer 72 such as a CRT display or an image recorder in which the image can be recorded on a photosensitive sheet to produce a hard copy. The magnified scattered-light image 8b can thus be reproduced as a final image having a desired field reached in the preceding field search mode. The final image is read from the second stimulable phosphor sheet 64 at a speed lower than the speed at which the image is read from the first stimulalbe phosphor sheet 46 so that the final image can be of sufficiently high quality. To this end, the primary and secondary scanning of the second stimulable phosphor 64 with the stimulating light 65a may be carried out at a relatively low speed, or the image may be read from the second stimulable phosphor 64 as smaller pixels.

After the final image has been read from the second stimulable phosphor sheet 64, the sheet 64 is delivered to a position below the erase light source 61. The second stimulable phosphor sheet 64 is then exposed to the erasing light emitted from the erase light source 61 so as to be reusable The electron microscope has a focusing control knob 30 which is identical to the focusing control knob 30 in the preceding embodiments and which is electrically coupled to the objective lens 6. Therefore, the magnified scattered-light image 8b can be brought into a proper focused condition by turning the focusing control knob while the image 8b is being displayed on the CRT display 69. By reading a portion or portions of the image at a higher density than in the field search mode, an image can be obtained for allowing accurate focusing in a short period of time. After a desired field has been determined, a focusing image may be reproduced from the second stimulable phosphor sheet 64 on the image reproducer 71, and the operator may adjust the focusing control knob while observing the image on the image reproducer 71.

Figure 9:
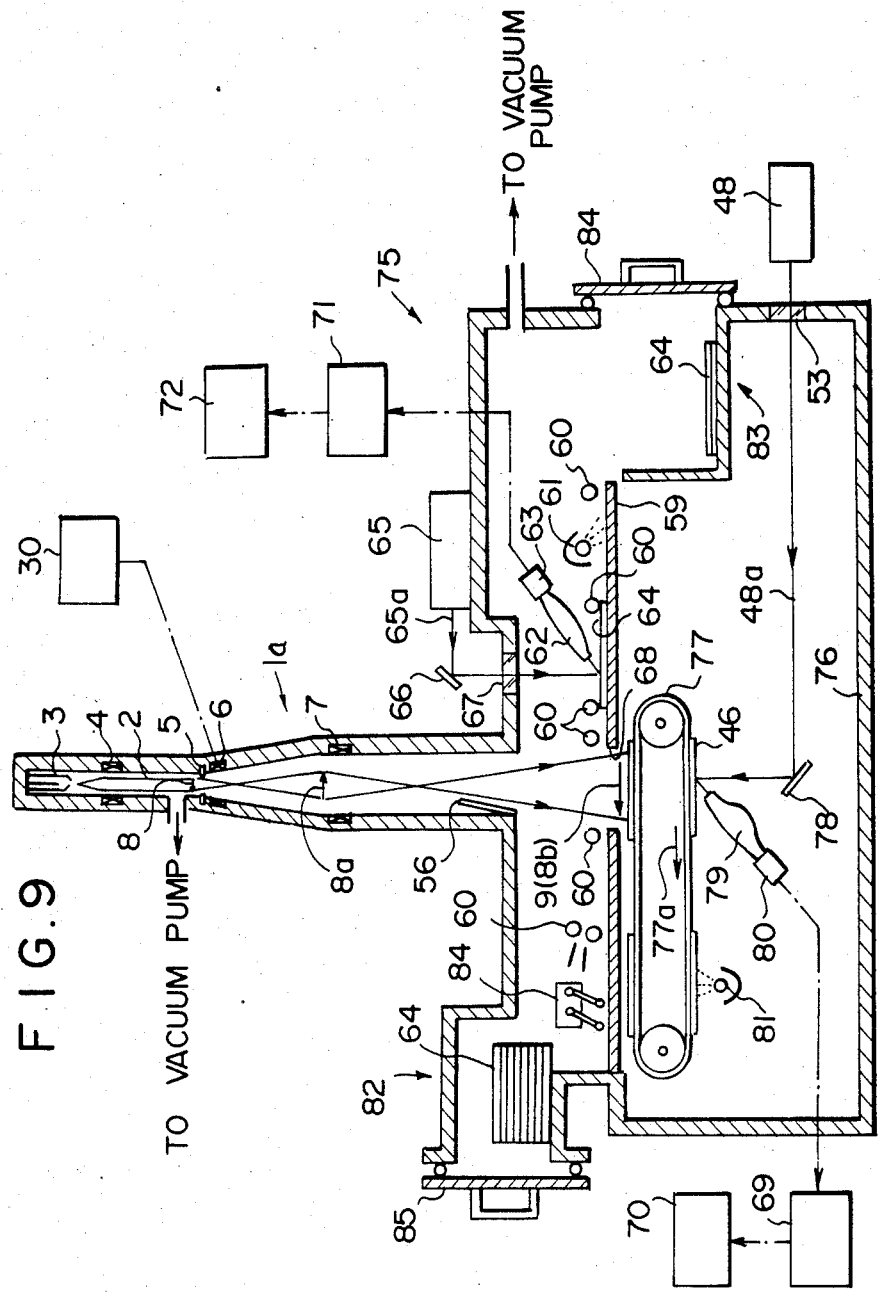

FIG. 9 shows an image recorder/reader 75 combined with the electron microscope for carrying out a method according to an eighth embodiment of the present invention. The image recorder/reader 75 has a casing 76 coupled to the lens barrel 1a and housing an endless belt 77 to which four first flexible stimulable phosphor sheets 46 are fixed at spaced intervals. When the shutter 56 is opened, the energy of the electron beam 2 is stored in one of the first stimulable phosphor sheets 46 positioned below the opening 68. Then, the endless belt 77 is moved in the direction of the arrow 77a to feed the exposed sheet 46 on the lower run thereof. The sheet 46 is then scanned by the stimulating light beam 48a emitted from the stimulating light source 48 and deflected by a light deflector 78. Light emitted from the sheet 46 is gathered by a light collecting body 79 and photoelectrically detected by a first photomultiplier 80 (advance reading mode). The output electric signal from the first photomultiplier 80 is fed through the image signal processor 69 to the CRT display 70 for a field search mode. After the image has been read from the first stimulable phosphor sheet 46, it is further conveyed by the endless belt 77 to a position above a first erase light source 81 which then erases any remanent image from the sheet 46.

The image recorder/reader 75 has a sheet supply unit 82 for storing a stack of second stimulable phosphor sheets 64 and a sheet receiving unit 83 for storing second stimulable phosphor sheets 64. The second stimulable phosphor sheets 64 can be taken out of the sheet supply unit 82 one by one by a sheet feed arm 84 and delivered on the sheet feed table 59 to the right (FIG. 9) by the sheet feed rollers 60. One of the second stimulable phosphor sheets 64 is placed over the opening 68 at a time, and exposed to the electron beam 2 bearing the magnified scattered-light image 8b. The second stimulable phosphor sheet 64 on which the magnified scattered-light image is thus carried as a final image is then further moved to the right for allowing the photoelectric transducer 63 to read the image from the sheet 64 (main reading mode) and also allowing the erase light source 61 to erase any residual image from the sheet 64. The second stimulable phosphor sheet 64 is then delivered into the sheet receiving unit 83. When all of the second stimulable phosphor sheets 64 in the sheet supply unit 82 have been consumed, a hatch 84 of the sheet receiving unit 83 is opened to take out the stacked stimulable phosphor sheets 64, and a hatch 85 of the sheet supply unit 82 is opened to place the stack of stimulable phosphor sheets 64 into the sheet supply unit 82. It is preferable to position a known shield member between the lens barrel 1a and the casing 76 for keeping the interior of the lens barrel 1a under vacuum even when the hatches 84, 85 are opened to vent the interior of the casing 76 to atmosphere. The residual image and noise can be removed from the stimulable phosphor sheets 64 by a separate eraser after the sheets 64 have been taken out of the sheet receiving unit 83.

FIG. 10 shows an image recorder/reader 90 for carrying out a method according to a ninth embodiment of the present invention. The image recorder/reader 90 is different from the image recorder/reader 75 of FIG. 9 in that the image recorder/reader 90 is dispensed with the second erase light source 61, the light collecting body 62, the second photomultiplier 63, the stimulating light source 65, and the light deflector 66. The second stimulable phosphor sheet 64 which stores the magnified scattered-light image 8b as a final image is therefore directly delivered into the sheet receiving unit 83 without the image being read (main reading mode) and exposure to the erasing light. The stacked second stimulable phosphor sheets 64 in the sheet receiving unit 83 are then taken out by opening the hatch 84, and processed by a separate image reader (not shown) for the main reading mode. This separate image reader may be constructed in the same manner as the reader sections of the image recorder/readers 45, 75.

In the embodiments shown in FIGS. 8 through 10, the first and second stimulable phosphor sheets 46, 64 for recording monitor and final images, respectively, are separate from each other. However, stimulable phosphor sheets may be fixed to a single circulating feed means such as the endless belt 77, and may be used for recording both monitor and final images. Separate use of the first and second stimulable phosphor sheets 46, 64 is more economical however since older or inferior stimulable phosphor sheets may be used only for recording monitor images.

FIG. 11 illustrates an image recorder/reader 95 for carrying out a method according to a tenth embodiment of the present invention. The image recorder/reader 95 has a driver 96 for driving the mirrors 49a, 49b to scan the stimulable phosphor sheet 46 two-dimensionally at different speeds when reading monitor and final images, respectively. The image recorder/reader 95 has only one image reader for reading both monitor and final images. After the magnified scattered-light image 8b of a desired field has been reproduced on the image reproducer 70 in the field search mode, the stimulable phosphor sheet 46 is exposed to erasing light emitted from the erase light source 52. Then, the electron beam energy representative of the magnified scattered-light image 8b as a final image is recorded on the stimulable phosphor sheet 46, and the final image is read from the sheet 46 by switching the driver 96 to turn the mirrors 49a, 49b at a speed for reading the final image. The monitor image is read from the stimulable phosphor sheet 46 at a higher speed or with lower stimulating light energy. Therefore, a detectable amount of electron beam energy still remains on the stimulable phosphor sheet 46 even after the monitor image has been read therefrom. If the magnified scattered-light image 8b of a desired field is confirmed on the image reproducer 70, then the driver 96 may be switched to the main final image reading mode without exposing the stimulable phosphor sheet 46 again to the electron beam 2 for thereby scanning the stimulable phosphor sheet 46 to read the final image.

Although certain preferred embodiments have been shown and described, it should be understood that many changes and modifications may be made therein without departing from the scope of the appended claims.

We claim:

1. A method of recording and reproducing an image produced by an electron microscope, comprising the steps of:
   (i) exposing a two-dimensional image sensor under vacuum to an electron beam having passed through a specimen to record at least one first magnified image of the specimen on the image sensor;
   (ii) applying a stimulating energy to said image sensor for discharging light therefrom which represents said first magnified image;
   (iii) photoelectrically detecting the light discharged from said image sensor to produce a first electric signal and processing said first electric signal to produce said first magnified image which can be observed to attain a desired focused condition and/or a desired field on the electron microscope;
   (iv) thereafter exposing a two-dimensional image sensor under vacuum to an electron beam having passed through said specimen to record a second magnified image of the specimen on the image sensor;
   (v) applying a stimulating energy to said image sensor for discharging light therefrom which represents said second magnified image; and
   (vi) photoelectrically detecting the light discharged from said image sensor to produce a second electric signal and processing said second electric signal to produce said second magnified image as a final image under said desired focused condition and/or with said desired field.

2. A method according to claim 1, wherein the light discharged from said image sensor is photoelectrically detected while said image sensor is placed under vacuum.

3. A method according to claim 1, wherein each of said two-dimensional image sensors comprises a stimulable phosphor sheet capable of discharging luminescence as said light upon exposure to said stimulating energy.

4. A method according to claim 3, wherein said stimulating energy is light.

5. A method according to claim 3, wherein said stimulating energy is heat.

6. A method according to claim 1, wherein said first magnified image is part of said second magnified image.

7. A method according to claim 1, wherein said first magnified image is composed of pixels larger than those of said second magnified image.

8. A method according to claim 1, wherein a plurality of said first magnified images of the specimen are successively produced which can be observed to attain different focused conditions and/or different fields, said second magnified image being produced as said final image under a selected one of said different focused conditions or with a selected one of said different fields.

9. A method according to claim 1, wherein the amount of said electron beam to record said first magnified image on said image sensor is lower than the amount of said electron beam to record said second magnified image on said image sensor.

10. A method according to claim 9, wherein said stimulating energy applied to said image sensor to discharge the light therefrom which represents said first magnified image is higher in level than said stimulating energy applied to said image sensor to discharge the light therefrom which represents said second magnified image.

11. A method according to claim 9, wherein said first-mentioned two-dimensional image sensor is higher in sensitivity than said second-mentioned two-dimensional image sensor.

12. A method according to claim 1, including the step of deriving read-out conditions and/or an image processing condition from said first electric signal, said second magnified image being produced as said final image also under said read-out conditions and/or said image processing condition.

13. A method according to claim 12, wherein said read-out conditions are a read-out gain and a scale factor.

* * * * *